(12) United States Patent
Ma et al.

(10) Patent No.: US 9,928,922 B2
(45) Date of Patent: Mar. 27, 2018

(54) SHIFT REGISTER AND METHOD FOR DRIVING THE SAME, GATE DRIVING CIRCUIT AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jingshan Ma, Beijing (CN); Shuai Xu, Beijing (CN); Zhengxin Zhang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 184 days.

(21) Appl. No.: 15/137,254

(22) Filed: Apr. 25, 2016

(65) Prior Publication Data
US 2017/0004888 A1 Jan. 5, 2017

(30) Foreign Application Priority Data

Jun. 30, 2015 (CN) .......................... 2015 1 0373239

(51) Int. Cl.
*G11C 19/00* (2006.01)
*G11C 19/28* (2006.01)
(Continued)

(52) U.S. Cl.
CPC ................ *G11C 19/28* (2013.01); *G06F 1/04* (2013.01); *G09G 3/2085* (2013.01);
(Continued)

(58) Field of Classification Search
None
See application file for complete search history.

(56) References Cited

U.S. PATENT DOCUMENTS 4,856,034 A * 8/1989 Takeuchi ............... G11C 19/28
377/73
4,860,327 A * 8/1989 Nakagawa ............. G11C 19/28
327/212

(Continued)

*Primary Examiner* — Tuan T Lam
(74) *Attorney, Agent, or Firm* — Nath, Goldberg & Meyer; Joshua B. Goldberg

(57) ABSTRACT

The present invention provides a shift register and a method for driving the same, a gate driving circuit and a display device, the shift register includes a NOR gate circuit, a latch circuit and an output control circuit. First to fourth input terminals of the NOR gate circuit are connected to a clock control signal terminal, a signal input terminal, a high-level power supply terminal and a low-level power supply terminal, respectively, and an output terminal thereof is connected to a first input terminal of the latch circuit; second to fourth input terminals of the latch circuit are connected to the signal input terminal, the high-level power supply terminal and the low-level power supply terminal, respectively, and first and second output terminals thereof are both connected to the output control circuit, which is connected to the clock control signal terminal, the low-level power supply terminal and a signal output terminal.

18 Claims, 4 Drawing Sheets

(51) Int. Cl.
  *G09G 3/20* (2006.01)
  *G06F 1/04* (2006.01)
  *G09G 3/36* (2006.01)

(52) U.S. Cl.
  CPC ... *G09G 3/3677* (2013.01); *G09G 2310/0286* (2013.01); *G09G 2310/08* (2013.01)

(56) References Cited

U.S. PATENT DOCUMENTS

| | | | | |
|---|---|---|---|---|
| 5,128,974 | A * | 7/1992 | Maekawa | G11C 19/28 377/117 |
| 6,839,398 | B2 * | 1/2005 | Sun | G11C 19/28 377/78 |
| 2005/0057553 | A1 * | 3/2005 | Shih | G09G 3/2096 345/211 |
| 2011/0033022 | A1 * | 2/2011 | Zebedee | G09G 3/20 377/81 |
| 2012/0306829 | A1 * | 12/2012 | Furuta | G11C 19/28 345/204 |
| 2015/0255171 | A1 * | 9/2015 | Nishi | G09G 3/3677 377/54 |
| 2017/0084238 | A1 * | 3/2017 | Cao | G09G 3/3266 |
| 2017/0103722 | A1 * | 4/2017 | Song | G09G 3/3677 |
| 2017/0162095 | A1 * | 6/2017 | Song | G09G 3/20 |
| 2017/0162152 | A1 * | 6/2017 | Zhao | G09G 3/3677 |

* cited by examiner

SHIFT REGISTER AND METHOD FOR DRIVING THE SAME, GATE DRIVING CIRCUIT AND DISPLAY DEVICE

FIELD OF THE INVENTION

The present invention belongs to the field of display technology, and specifically relates to a shift register and a method for driving the same, a gate driving circuit and a display device.

BACKGROUND OF THE INVENTION

Liquid crystal displays have been widely used in electronic display products, such as televisions, computers, mobile phones and personal digital assistants and the like. A liquid crystal display includes a source driver (i.e., a driver for data), a gate driver, a liquid crystal display panel and the like. The liquid crystal display panel has a pixel array therein, which includes multiple rows of pixel units, and the gate driver is used for turning on, sequentially, each corresponding row of pixel units in the pixel array, so as to transmit the pixel data outputted from the source driver to the row of pixel units and then to display an image to be displayed.

In the present, the gate driver is generally formed on an array substrate of the liquid crystal display by an array process, i.e., a gate-driver-on-array (referred to as GOA) process. Such a process for integration is not only cost-saving but also better-looking symmetrically at both sides of a liquid crystal panel, and also saves a bonding area of the gate integrated circuit as well as a fan-out wiring space, thereby implementing a narrow-bezel design of the display device; moreover, such a process for integration also eliminates the need for a bonding process for a gate line, thereby increasing a production capacity and yield thereof.

A conventional gate driver generally consists of a plurality of cascaded shift registers, and each shift register comprises a plurality of thin film transistors and a storage capacitor(s), wherein the storage capacitor(s) is connected to the signal output terminal of the shift register, for maintaining an output voltage of the signal output terminal.

However, a disposed storage capacitor needs to occupy a large area, and thus causes the whole area of the shift register to be large, which is disadvantageous to the implementation of a narrow-bezel display panel.

SUMMARY OF THE INVENTION

The embodiments of the present invention provides a shift register and a method for driving the same, a gate driving circuit and a display device, wherein the shift register has a simple structure and does not need to be provided with a storage capacitor, thereby reducing the whole area of the shift register and hence facilitating the implementation of the narrow bezel.

The embodiments of the present invention provides a shift register, which comprises a NOR gate circuit, a latch circuit and an output control circuit, wherein, a first input terminal of the NOR gate circuit is connected to a clock control signal terminal, a second input terminal of the NOR gate circuit is connected to a signal input terminal, a third input terminal of the NOR gate circuit is connected to a high-level power supply terminal, a fourth input terminal of the NOR gate circuit is connected to a low-level power supply terminal, and an output terminal of the NOR gate circuit is connected to a first input terminal of the latch circuit;

a second input terminal of the latch circuit is connected to the signal input terminal, a third input terminal of the latch circuit is connected to the high-level power supply terminal, a fourth input terminal of the latch circuit is connected to the low-level power supply terminal, and both a first output terminal and a second output terminal of the latch circuit are connected to the output control circuit, wherein the first and second input terminals of the latch circuit correspond to the first and second output terminals of the latch circuit, respectively; and the output control circuit is connected to the clock control signal terminal, the low-level power supply terminal and a signal output terminal, and is used for outputting a clock control signal, provided by the clock control signal terminal, to the signal output terminal when a high-level signal is outputted from the first output terminal of the latch circuit, or for outputting a low-level power supply signal, provided by the low-level power supply terminal, to the signal output terminal when a high-level signal is outputted from the second output terminal of the latch circuit.

The NOR gate circuit may include a first transistor, a second transistor and a third transistor, wherein, a control electrode of the first transistor is connected to a first electrode of the first transistor and the high-level power supply terminal, and a second electrode of the first transistor is connected to a second electrode of the second transistor, a second electrode of the third transistor and the first input terminal of the latch circuit;

a control electrode of the second transistor is connected to the clock control signal terminal, a first electrode of the second transistor is connected to the low-level power supply terminal, and the second electrode of the second transistor is connected to the first input terminal of the latch circuit; and a control electrode of the third transistor is connected to the signal input terminal, a first electrode of the third transistor is connected to the low-level power supply terminal, and the second electrode of the third transistor is connected to the first input terminal of the latch circuit.

The latch circuit may include a first NOR gate sub circuit and a second NOR gate sub circuit, wherein, a first input terminal of the first NOR gate sub circuit is connected to the output terminal of the NOR gate circuit, a second input terminal of the first NOR gate sub circuit is connected to an output terminal of the second NOR gate sub circuit, and an output terminal of the first NOR gate sub circuit is connected to the output control circuit and a second input terminal of the second NOR gate sub circuit;

a first input terminal of the second NOR gate sub circuit is connected to the signal input terminal, and the output terminal of the second NOR gate sub circuit is connected to the output control circuit; and the first input terminal of the first NOR gate sub circuit is the first input terminal of the latch circuit, the first input terminal of the second NOR gate sub circuit is the second input terminal of the latch circuit, the output terminal of the first NOR gate sub circuit is the first output terminal of the latch circuit, and the output terminal of the second NOR gate sub circuit is the second output terminal of the latch circuit.

The first NOR gate sub circuit may include a fourth transistor, a fifth transistor and a sixth transistor, wherein, a control electrode of the fourth transistor is connected to the output terminal of the NOR gate circuit, a first electrode of the fourth transistor is connected to the low-level power supply terminal, and a second electrode of the fourth transistor is connected to the output control circuit and a second electrode of the sixth transistor;

a control electrode of the fifth transistor is connected to the output terminal of the second NOR gate sub circuit, a first electrode of the fifth transistor is connected to the low-level power supply terminal, and a second electrode of the fifth transistor is connected to the output control circuit and the second electrode of the sixth transistor;

a control electrode of the sixth transistor is connected to a first electrode of the sixth transistor and the high-level power supply terminal, and the second electrode of the sixth transistor is connected to the output control terminal; and the second electrode of the fourth transistor, the second electrode of the fifth transistor and the second electrode of the sixth transistor are connected at the output terminal of the first NOR gate sub circuit.

The second NOR gate sub circuit may include a seventh transistor, an eighth transistor and a ninth transistor, wherein, a control electrode of the seventh transistor is connected to the signal input terminal, a first electrode of the seventh transistor is connected to the low-level power supply terminal, and a second electrode of the seventh transistor is connected to the output control circuit and a second electrode of the ninth transistor;

a control electrode of the eighth transistor is connected to the output terminal of the first NOR gate sub circuit, a first electrode of the eighth transistor is connected to the low-level power supply terminal, and the second electrode of the eighth transistor is connected to the output control circuit and the second electrode of the ninth transistor; and a control electrode of the ninth transistor is connected to a first electrode of the ninth transistor and the high-level power supply terminal, and the second electrode of the ninth transistor is connected to the output control circuit.

The output control circuit may include a tenth transistor and an eleventh transistor, wherein a control electrode of the tenth transistor is connected to the first output terminal of the latch circuit, a first electrode of the tenth transistor is connected to the clock control signal terminal, and a second electrode of the tenth transistor is connected to the signal output terminal; and a control electrode of the eleventh transistor is connected to the second output terminal of the latch circuit, a first electrode of the eleventh transistor is connected to the low-level power supply terminal, and a second electrode of the eleventh transistor is connected to the signal output terminal.

All transistors in the shift register may be N-type transistors.

The embodiments of the present invention provides a method for driving the above-mentioned shift register, the method includes:

in a first period, the clock control signal inputted from the clock control signal terminal is a low-level signal, an input signal inputted from the signal input terminal is a high-level signal, a low-level signal is outputted from the output terminal of the NOR gate circuit, a high-level signal is outputted from the first output terminal of the latch circuit, a low-level signal is outputted from the second output terminal of the latch circuit, and a low-level signal is outputted from the signal output terminal;

in a second period, the clock control signal inputted from the clock control signal terminal is a high-level signal, the input signal inputted from the signal input terminal is a low-level signal, a low-level signal is outputted from the output terminal of the NOR gate circuit, a high-level signal is outputted from the first output terminal of the latch circuit, a low-level signal is outputted from the second output terminal of the latch circuit, and a high-level signal is outputted from the signal output terminal;

in a third period, the clock control signal inputted from the clock control signal terminal is a low-level signal, the input signal inputted from the signal input terminal is a low-level signal, a high-level signal is outputted from the output terminal of the NOR gate circuit, a low-level signal is outputted from the first output terminal of the latch circuit, a high-level signal is outputted from the second output terminal of the latch circuit, and a low-level signal is outputted from the signal output terminal; and in a fourth period, the clock control signal inputted from the clock control signal terminal is a high-level signal, the input signal inputted from the signal input terminal is a low-level signal, a low-level signal is outputted from the output terminal of the NOR gate circuit, a low-level signal is outputted from the first output terminal of the latch circuit, a high-level signal is outputted from the second output terminal of the latch circuit, and a low-level signal is outputted from the signal output terminal.

The embodiments of the present invention provides another shift register, which comprises a NOR gate circuit, a latch circuit and an output control circuit, wherein, a first input terminal of the NOR gate circuit is connected to a clock control signal terminal, a second input terminal of the NOR gate circuit is connected to a signal input terminal, a third input terminal of the NOR gate circuit is connected to a high-level power supply terminal, a fourth input terminal of the NOR gate circuit is connected to a low-level power supply terminal, and an output terminal of the NOR gate circuit is connected to a second input terminal of the latch circuit;

a first input terminal of the latch circuit is connected to the signal input terminal, a third input terminal of the latch circuit is connected to the high-level power supply terminal, a fourth input terminal of the latch circuit is connected to the low-level power supply terminal, and both a first output terminal and a second output terminal of the latch circuit are connected to the output control circuit, wherein the first and second input terminals of the latch circuit correspond to the first and second output terminals of the latch circuit, respectively; and the output control circuit is connected to the clock control signal terminal, the low-level power supply terminal and a signal output terminal, and is used for outputting a clock control signal, provided by the clock control signal terminal, to the signal output terminal when a low-level signal is outputted from the first output terminal of the latch circuit, or for outputting a low-level power supply signal, provided by the low-level power supply terminal, to the signal output terminal when a low-level signal is outputted from the second output terminal of the latch circuit.

The NOR gate circuit may include a first transistor, a second transistor and the third transistor, wherein, a control electrode of the first transistor is connected to a first electrode of the first transistor and the low-level power supply terminal, and a second electrode of the first transistor is connected to a second electrode of the second transistor and the second input terminal of the latch circuit;

a control electrode of the second transistor is connected to the clock control signal terminal, a first electrode of the second transistor is connected to a second electrode of the third transistor, and the second electrode of the second transistor is connected to the second input terminal of the latch circuit; and a control electrode of the third transistor is connected to the signal input terminal, and a first electrode of the third transistor is connected to the high-level power supply terminal.

The latch circuit may include a first NOR gate sub circuit and a second NOR gate sub circuit, wherein, a first input terminal of the first NOR gate sub circuit is connected to the signal input terminal, a second input terminal of the first NOR gate sub circuit is connected to an output terminal of the second NOR gate sub circuit, and an output terminal of the first NOR gate sub circuit is connected to the output control circuit and a second input terminal of the second NOR gate sub circuit;

a first input terminal of the second NOR gate sub circuit is connected to the output terminal of the NOR gate circuit, and the output terminal of the second NOR gate sub circuit is connected to the output control circuit; and the first input terminal of the first NOR gate sub circuit is the first input terminal of the latch circuit, the first input terminal of the second NOR gate sub circuit is the second input terminal of the latch circuit, the output terminal of the first NOR gate sub circuit is the first output terminal of the latch circuit, and the output terminal of the second NOR gate sub circuit is the second output terminal of the latch circuit.

The first NOR gate sub circuit may include a fourth transistor, a fifth transistor and a sixth transistor, wherein, a control electrode of the fourth transistor is connected to the signal input terminal, a first electrode of the fourth transistor is connected to a second electrode of the fifth transistor, and a second electrode of the fourth transistor is connected to the output control circuit and a second electrode of the sixth transistor;

a control electrode of the fifth transistor is connected to the output terminal of the second NOR gate sub circuit, and a first electrode of the fifth transistor is connected to the high-level power supply terminal; and a control electrode of the sixth transistor is connected to a first electrode of the sixth transistor and the low-level power supply terminal, and the second electrode of the sixth transistor is connected to the output control circuit.

The second NOR gate sub circuit may include a seventh transistor, an eighth transistor and a ninth transistor, wherein, a control electrode of the seventh transistor is connected to the output terminal of the NOR gate circuit, a first electrode of the seventh transistor is connected to a second electrode of the eighth transistor, and a second electrode of the seventh transistor is connected to the output control circuit and a second electrode of the ninth transistor;

a control electrode of the eighth transistor is connected to the output terminal of the first NOR gate sub circuit, a first electrode of the eighth transistor is connected to the high-level power supply terminal, and the second electrode of the eighth transistor is connected to the output control circuit and the second electrode of the ninth transistor; and a control electrode of the ninth transistor is connected to a first electrode of the ninth transistor and the low-level power supply terminal, and the second electrode of the ninth transistor is connected to the output control circuit.

The output control circuit may include a tenth transistor and an eleventh transistor, wherein a control electrode of the tenth transistor is connected to the first output terminal of the latch circuit, a first electrode of the tenth transistor is connected to the clock control signal terminal, and a second electrode of the tenth transistor is connected to the signal output terminal; and a control electrode of the eleventh transistor is connected to the second output terminal of the latch circuit, a first electrode of the eleventh transistor is connected to the low-level power supply terminal, and a second electrode of the eleventh transistor is connected to the signal output terminal.

All transistors in the shift register may be P-type transistors.

The embodiments of the present invention provides another method for driving the above-mentioned shift register, the method includes:

in a first period, the clock control signal inputted from the clock control signal terminal is a low-level signal, an input signal inputted from the signal input terminal is a high-level signal, a low-level signal is outputted from the output terminal of the NOR gate circuit, a low-level signal is outputted from the first output terminal of the latch circuit, a high-level signal is outputted from the second output terminal of the latch circuit, and a low-level signal is outputted from the signal output terminal;

in a second period, the clock control signal inputted from the clock control signal terminal is a high-level signal, the input signal inputted from the signal input terminal is a low-level signal, a low-level signal is outputted from the output terminal of the NOR gate circuit, a low-level signal is outputted from the first output terminal of the latch circuit, a high-level signal is outputted from the second output terminal of the latch circuit, and a high-level signal is outputted from the signal output terminal;

in a third period, the clock control signal inputted from the clock control signal terminal is a low-level signal, the input signal inputted from the signal input terminal is a low-level signal, a high-level signal is outputted from the output terminal of the NOR gate circuit, a high-level signal is outputted from the first output terminal of the latch circuit, a low-level signal is outputted from the second output terminal of the latch circuit, and a low-level signal is outputted from the signal output terminal; and in a fourth period, the clock control signal inputted from the clock control signal terminal is a high-level signal, the input signal inputted from the signal input terminal is a low-level signal, a low-level signal is outputted from the output terminal of the NOR gate circuit, a high-level signal is outputted from the first output terminal of the latch circuit, a low-level signal is outputted from the second output terminal of the latch circuit, and a low-level signal is outputted from the signal output terminal.

The embodiments of the present invention further provides a gate driving circuit which includes a plurality of cascaded above-mentioned shift registers, wherein the signal input terminal of each stage of the shift register, except for the first stage of the shift register and the last stage of the shift register, is connected to the signal output terminal of the previous stage of the shift register, and a frame starting signal is provided to the signal input terminal of the first stage of the shift register. Gate driving signals are outputted, by the gate driving circuit, sequentially from the signal output terminals of respective stages of the shift registers.

The embodiments of the present invention further provides a display device including the above-mentioned gate driving circuit.

DETAILED DESCRIPTION OF THE EMBODIMENTS

To make those skilled in the art better understand the technical solutions of the present invention, a shift register and a method for driving the same, a gate driving circuit and a display device provided by the embodiments of the present invention will be described in detail below in conjunction with the accompanying drawings.

First Embodiment

Figure 1:
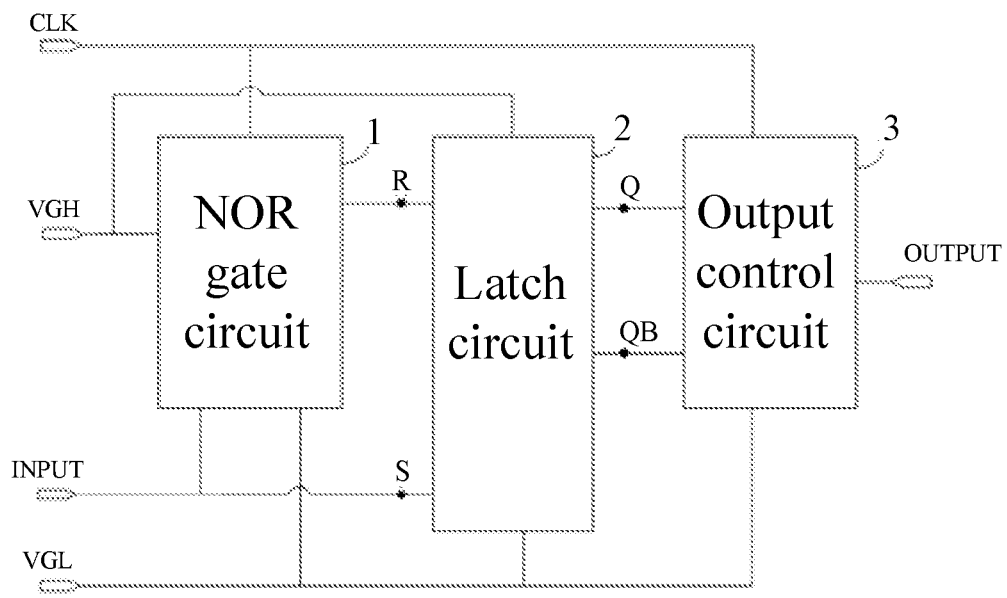
FIG. 1 is a structural schematic diagram of a shift register provided by an embodiment of the present invention.

FIG. 1 is a structural schematic diagram of a shift register provided by the first embodiment of the present invention. As show in FIG. 1, the shift register includes a NOR gate circuit 1, a latch circuit 2 and an output control circuit 3. A first input terminal of the NOR gate circuit 1 is connected to a clock control signal terminal CLK, a second input terminal of the NOR gate circuit 1 is connected to a signal input terminal INPUT, a third input terminal of the NOR gate circuit 1 is connected to a high-level power supply terminal VGH, a fourth input terminal of the NOR gate circuit 1 is connected to a low-level power supply terminal VGL, and an output terminal of the NOR gate circuit 1 is connected to a first input terminal R of the latch circuit 2; a second input terminal S of the latch circuit 2 is connected to the signal input terminal INPUT, a third input terminal of the latch circuit 2 is connected to the high-level power supply terminal VGH, a fourth input terminal of the latch circuit 2 is connected to the low-level power supply terminal VGL, and both a first output terminal Q and a second output terminal QB of the latch circuit 2 are connected to the output control circuit 3, wherein the first input terminal R and the second input terminal S of the latch circuit 2 correspond to the first output terminal Q and the second output terminal QB of the latch circuit 2, respectively; the output control circuit 3 is connected to the clock control signal terminal CLK, the low-level power supply terminal VGL and a signal output terminal OUTPUT, and is used for outputting a clock control signal, provided by the clock control signal terminal CLK, to the signal output terminal OUTPUT when a high-level signal is outputted from the first output terminal Q of the latch circuit 2, or for outputting a low-level power supply signal, provided by the low-level power supply terminal VGL, to the signal output terminal OUTPUT when a high-level signal is outputted from the second output terminal QB of the latch circuit 2.

The shift register provided by this embodiment has a simple structure and does not need to be provided with a storage capacitor, so the whole area of the shift register can be efficiently reduced, thereby facilitating the implementation of the narrow bezel.

Second Embodiment

Figure 2:
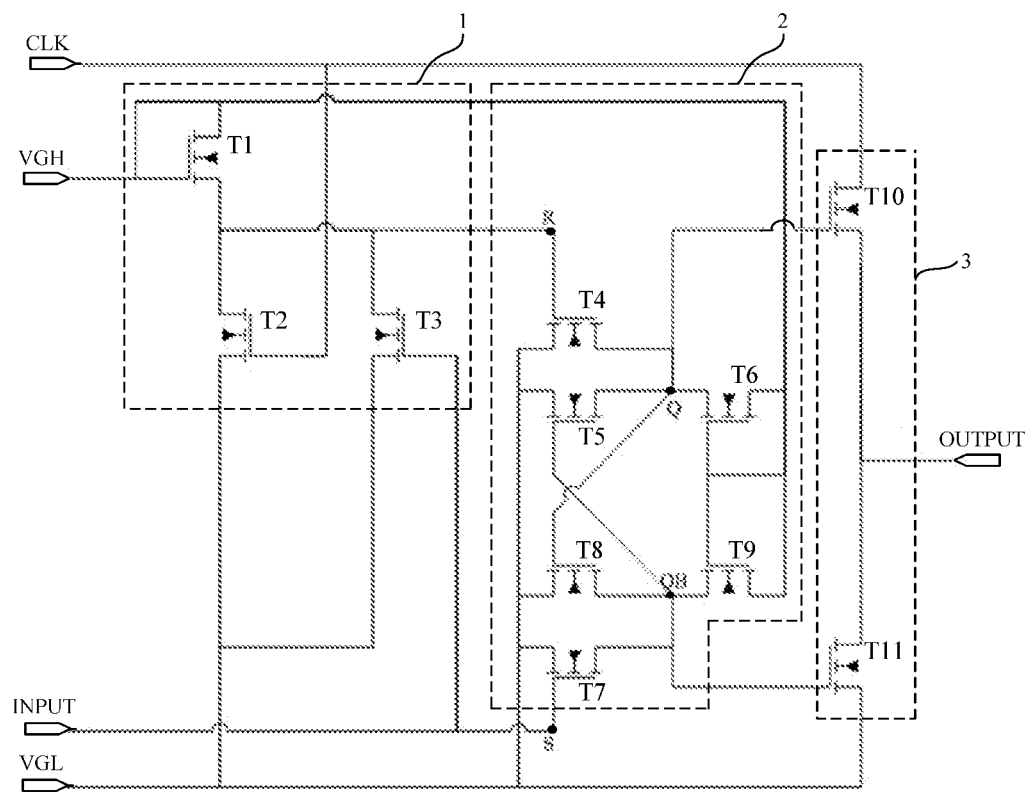
FIG. 2 is a circuit schematic diagram of a shift register provided by an embodiment of the present invention.

FIG. 2 is a circuit schematic diagram of a shift register provided by the second embodiment of the present invention. As show in FIG. 2, the shift register shown in FIG. 2 may correspond to the shift register shown in FIG. 1. Specifically, the NOR gate circuit 1 of the shift register includes a first transistor T1, a second transistor T2 and a third transistor T3. A control electrode of the first transistor T1 is connected to a first electrode of the first transistor T1 as well as the high-level power supply terminal VGH, and a second electrode of the first transistor T1 is connected to a second electrode of the second transistor T2, a second electrode of the third transistor T3 and the first input terminal R of the latch circuit 2; a control electrode of the second transistor T2 is connected to the clock control signal terminal CLK, a first electrode of the second transistor T2 is connected to the low-level power supply terminal VGL, and the second electrode of the second transistor T2 is connected to the first input terminal R of the latch circuit 2; a control electrode of the third transistor T3 is connected to the signal input terminal INPUT, a first electrode of the third transistor T3 is connected to the low-level power supply terminal VGL, and the second electrode of the third transistor T3 is connected to the first input terminal R of the latch circuit 2.

It needs to be explained that the above specific structure of the NOR gate circuit 1 is only an optional solution in this embodiment, and the NOR gate circuit 1 in this embodiment may further employ other structures, which are not listed and illustrated herein.

The latch circuit 2 may include a first NOR gate sub circuit and a second NOR gate sub circuit, wherein a first input terminal of the first NOR gate sub circuit is connected to the output terminal of the NOR gate circuit 1, a second input terminal of the first NOR gate sub circuit is connected to an output terminal of the second NOR gate sub circuit, and an output terminal of the first NOR gate sub circuit is connected to the output control circuit 3 and a second input terminal of the second NOR gate sub circuit; a first input terminal of the second NOR gate sub circuit is connected to the signal input terminal INPUT, and the output terminal of the second NOR gate sub circuit is connected to the output control circuit 3; the first input terminal of the first NOR gate sub circuit is the first input terminal R of the latch circuit 2, the first input terminal of the second NOR gate sub circuit is the second input terminal S of the latch circuit 2, the output terminal of the first NOR gate sub circuit is the first output terminal Q of the latch circuit 2, and the output terminal of the second NOR gate sub circuit is the second output terminal QB of the latch circuit 2.

Specifically, the first NOR gate sub circuit may include a fourth transistor T4, a fifth transistor T5 and a sixth transistor T6, wherein, a control electrode (which corresponds to the first input terminal of the first NOR gate sub circuit) of the fourth transistor T4 is connected to the output terminal of the NOR gate circuit 1, a first electrode of the fourth transistor T4 is connected to the low-level power supply terminal VGL, and a second electrode of the fourth transistor T4 is connected to the output control circuit 3 and a second electrode of the sixth transistor T6; a control electrode (which corresponds to the second input terminal of the first NOR gate sub circuit) of the fifth transistor T5 is connected to the output terminal of the second NOR gate sub circuit, a first electrode of the fifth transistor T5 is connected to the low-level power supply terminal VGL, and a second electrode of the fifth transistor T5 is connected to the output control circuit 3 and a second electrode of the sixth transistor T6; a control electrode of the sixth transistor T6 is connected to a first electrode of the sixth transistor T6 as well as the high-level power supply terminal VGH, and the second electrode of the sixth transistor T6 is connected to the output control terminal 3; the second electrode of the fourth transistor T4, the second electrode of the fifth transistor T5 and the second electrode of the sixth transistor T6 are connected at the output terminal of the first NOR gate sub circuit.

Specifically, the second NOR gate sub circuit may include a seventh transistor T7, an eighth transistor T8 and a ninth transistor T9. A control electrode (which corresponds to the first input terminal of the second NOR gate sub circuit) of the seventh transistor T7 is connected to the signal input terminal INPUT, a first electrode of the seventh transistor T7 is connected to the low-level power supply terminal VGL, and a second electrode of the seventh transistor T7 is connected to the output control circuit 3 and a second electrode of the ninth transistor T9; a control electrode (which corresponds to the second input terminal of the second NOR gate sub circuit) of the eighth transistor T8 is connected to the output terminal of the first NOR gate sub circuit, a first electrode of the eighth transistor T8 is connected to the low-level power supply terminal VGL, and a second electrode of the eighth transistor T8 is connected to the output control circuit 3 and a second electrode of the ninth transistor T9; a control electrode of the ninth transistor T9 is connected to a first electrode of the ninth transistor T9 as well as the high-level power supply terminal VGH, and the second electrode of the ninth transistor T9 is connected to the output control circuit 3. The second electrode of the seventh transistor T7, the second electrode of the eighth transistor T8 and the second electrode of the ninth transistor T9 are connected at the output terminal of the second NOR gate sub circuit.

It needs to be explained that the above specific structure of the latch circuit 2 is only an optional solution in this embodiment, and the latch circuit 2 in this embodiment may further employ other structures, which are not listed and illustrated herein.

The output control circuit 3 may include a tenth transistor T10 and an eleventh transistor T11; wherein a control electrode of the tenth transistor T10 is connected to the first output terminal Q of the latch circuit 2, a first electrode of the tenth transistor T10 is connected to the clock control signal terminal CLK, and a second electrode of the tenth transistor T10 is connected to the signal output terminal OUTPUT; a control electrode of the eleventh transistor T11 is connected to the second output terminal QB of the latch circuit 2, a first electrode of the eleventh transistor T11 is connected to the low-level power supply terminal VGL, and a second electrode of the eleventh transistor T11 is connected to the signal output terminal OUTPUT.

It needs to be explained that transistor(s) in the above circuits is separately selected from one of polysilicon thin-film transistors, amorphous silicon thin-film transistors, oxide thin-film transistors and organic thin-film transistors. The "control electrode" referred to in this embodiment particularly means a gate of a transistor, "first electrode" particularly means a source of a transistor, and correspondingly, "second electrode" particularly means a drain of a transistor. Apparently, those skilled in the art should aware that the "first electrode" and the "second electrode" may interchange with each other.

In the above shift register provided by this embodiment, all transistors in the above-mentioned structures may be N-type transistors.

It needs to be explained that, among all above-mentioned transistors, the first transistor T1, the sixth transistor T6 and the ninth transistor T9 are all used as loads having a large impedance, and the remaining transistors are all used as switches.

An operation process of the shift register in this embodiment will be described in detail below in conjunction with the accompanying drawings. Here, it is assumed that each transistor in the shift register is an N-type transistor, which is turned on with a high level at the control electrode and is turned off with a low level at the control electrode.

Figure 3:
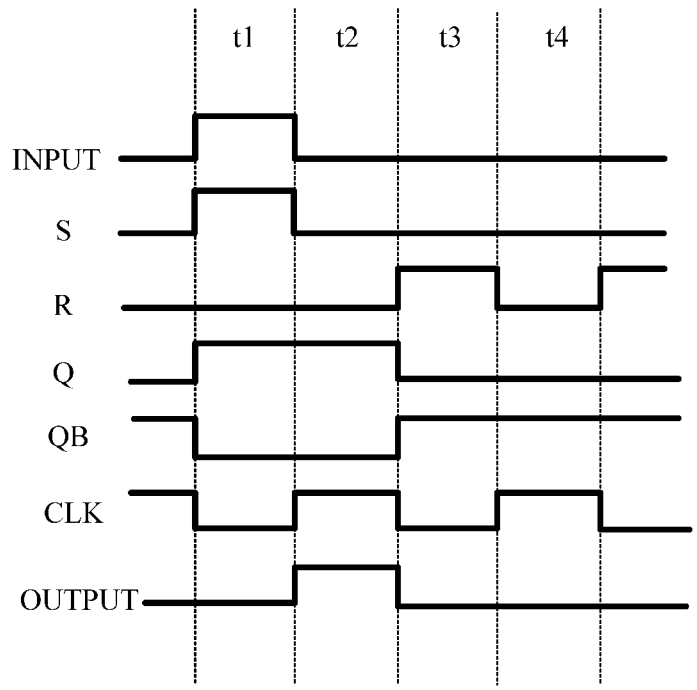
FIG. 3 is an operation timing diagram of the shift register as shown in FIG. 2.

FIG. 3 is an operation timing diagram of the shift register as shown in FIG. 2, and as shown in FIG. 3, the operation process of the shift register includes a first period to a fourth period as follows.

In the first period t1, the clock control signal inputted from the clock control signal terminal CLK is a low-level signal, and the input signal inputted from the signal input terminal INPUT is a high-level signal. At this time, the third transistor T3, the seventh transistor T7, the eighth transistor T8 and the tenth transistor T10 are all turned on, and the second transistor T2, the fourth transistor T4, the fifth transistor T5 and the eleventh transistor T11 are all turned off.

Specifically, in the NOR gate circuit 1, since the clock control signal inputted from the clock control signal terminal CLK is a low-level signal and the input signal is a high-level signal, the second transistor T2 is turned off and the third transistor T3 is turned on, and at this time, the output terminal of the NOR gate circuit 1 outputs a low-level signal, i.e., the signal at the first input terminal R of the latch circuit 2 is a low-level signal.

In the latch circuit 2, since the signal inputted from the second input terminal S (i.e., the signal input terminal INPUT) of the latch circuit 2 is a high-level signal, the seventh transistor T7 is turned on, and at this time, the second output terminal QB of the latch circuit 2 outputs a low-level signal, and the fifth transistor T5 is turned off. In the meantime, since the signal inputted from the first input terminal R of the latch circuit 2 is a low-level signal, the fourth transistor T4 is turned off, and a current loop including the sixth transistor T6 cannot be formed due to the turning off for both the fourth transistor T4 and the fifth transistor T5, and thus a high-level signal outputted from the high-level power supply terminal VGH may be transferred to the first output terminal Q of the latch circuit 2 through the sixth transistor T6, i.e., a high-level signal is outputted from the first output terminal Q of the latch circuit 2.

In the output control circuit 3, since a low-level signal is outputted from the second output terminal QB of the latch circuit 2, the eleventh transistor T11 is turned off. In the meantime, since a high-level signal is outputted from the first output terminal Q of the latch circuit 2, the tenth transistor T10 is turned on, and because the signal inputted from the clock control signal terminal CLK is a low-level signal at this time, a low-level signal is outputted from the signal output terminal OUTPUT of the shift register.

In the second period t2, the clock control signal inputted from the clock control signal terminal CLK is a high-level signal, and the input signal inputted from the signal input terminal INPUT is a low-level signal. At this time, the second transistor T2, the eighth transistor T8 and the tenth transistor T10 are turned on, and the third transistor T3, the fourth transistor T4, the fifth transistor T5, the seventh transistor T7 and the eleventh transistor T11 are turned off.

Specifically, in the NOR gate circuit 1, since the clock control signal inputted from the clock control signal terminal CLK is a high-level signal and the input signal is a low-level signal, the second transistor T2 is turned on and the third transistor T3 is turned off, and at this time, the output terminal of the NOR gate circuit 1 outputs a low-level signal, i.e., the signal at the first input terminal R of the latch circuit 2 is a low-level signal.

In the latch circuit 2, since the signal inputted from the first input terminal R of the latch circuit 2 is a low-level signal, the fourth transistor T4 is turned off, and in the meantime, since the signal inputted from the second input terminal S of the latch circuit 2 is a low-level signal, the seventh transistor T7 is turned off. At this time, the first output terminal Q and the second output terminal QB of the latch circuit 2 retain the output signals of the previous period (the first period t1), i.e., the first output terminal Q of the latch circuit 2 outputs a high-level signal, and the second output terminal QB of the latch circuit 2 outputs a low-level signal.

In the output control circuit 3, since a low-level signal is outputted from the second output terminal QB of the latch circuit 2, the eleventh transistor T11 is turned off. In the meantime, since a high-level signal is outputted from the first output terminal Q of the latch circuit 2, the tenth transistor T10 is turned on, and because the signal inputted from the clock control signal terminal CLK is a high-level signal at this time, a high-level signal is outputted from the signal output terminal OUTPUT of the shift register.

In the third period t3, the clock control signal inputted from the clock control signal terminal CLK is a low-level signal, and the input signal inputted from the signal input terminal INPUT is a low-level signal. At this time, the fourth transistor T4, the fifth transistor T5 and the eleventh transistor T11 are turned on, and the second transistor T2, the third transistor T3, the seventh transistor T7, the eighth transistor T8 and the tenth transistor T10 are turned off.

Specifically, in the NOR gate circuit 1, since the clock control signal inputted from the clock control signal terminal CLK is a low-level signal and the input signal is a low-level signal, the second transistor T2 and the third transistor T3 are both turned off, and at this time, no current loop including the first transistor T1 has been formed, and thus a high-level signal outputted from the high-level power supply terminal VGH may be transferred to the first input terminal R of the latch circuit 2 through the first transistor T1.

In the latch circuit 2, since the signal at the first input terminal R of the latch circuit 2 is a high-level signal, the fourth transistor T4 is turned on, the first output terminal Q of the latch circuit 2 outputs a low-level signal, and the eighth transistor T8 is turned off. In the meantime, since the signal inputted from the second input terminal S (i.e., the signal input terminal INPUT) of the latch circuit 2 is a low-level signal, the seventh transistor T7 is turned off, and at this time, no current loop including the ninth transistor T9 has been formed, and thus a high-level signal outputted from the high-level power supply terminal VGH may be transferred to the second output terminal QB of the latch circuit 2 through the ninth transistor T9, i.e., the second output terminal QB of the latch circuit 2 outputs a high-level signal.

In the output control circuit 3, since a low-level signal is outputted from the first output terminal Q of the latch circuit 2, the tenth transistor T10 is turned off. In the meantime, since a high-level signal is outputted from the second output terminal QB of the latch circuit 2, the eleventh transistor T11 is turned on, a low-level signal provided by the low-level power supply terminal VGL is transferred to the signal output terminal OUTPUT through the eleventh transistor T11, and a low-level signal is outputted from the signal output terminal OUTPUT.

In the fourth period t4, the clock control signal inputted from the clock control signal terminal CLK is a high-level signal, and the input signal inputted from the signal input terminal INPUT is a low-level signal. At this time, the second transistor T2, the fifth transistor T5 and the eleventh transistor T11 are turned on, and the third transistor T3, the fourth transistor T4, the seventh transistor T7, the eighth transistor T8 and the tenth transistor T10 are turned off.

Specifically, in the NOR gate circuit 1, since the clock control signal inputted from the clock control signal terminal CLK is a high-level signal and the input signal is a low-level signal, the second transistor T2 is turned on and the third transistor T3 is turned off, and at this time, the output terminal of the NOR gate circuit 1 outputs a low-level signal, i.e., the signal at the first input terminal R of the latch circuit 2 is a low-level signal.

In the latch circuit 2, since the signal at the first input terminal R of the latch circuit 2 is a low-level signal, the fourth transistor T4 is turned off, and in the meantime, since the signal inputted from the second input terminal S of the latch circuit 2 is a low-level signal, the seventh transistor T7 is turned off. At this time, the first output terminal Q and the second output terminal QB of the latch circuit 2 retain the output signals of the previous period (the third period t3), i.e., the first output terminal Q of the latch circuit 2 outputs a low-level signal, and the second output terminal QB of the latch circuit 2 outputs a high-level signal.

In the output control circuit 3, since a low-level signal is outputted from the first output terminal Q of the latch circuit 2, the tenth transistor T10 is turned off. In the meantime, since a high-level signal is outputted from the second output terminal QB of the latch circuit 2, the eleventh transistor T11 is turned on, and a low-level signal provided by the low-level power supply terminal VGL is transferred to the signal output terminal OUTPUT through the eleventh transistor T11, i.e., the signal output terminal OUTPUT outputs a low-level signal.

Thereafter, the above third period t3 and the above fourth period t4 are repeated until the input signal inputted from the signal input terminal INPUT is changed to a high-level signal. The first period t1 is restarted at the time when the input signal inputted from the signal input terminal INPUT is changed to a high-level signal.

It could be seen from the above-mentioned process that, the shift register provided by this embodiment can realize a function of the conventional shift register only by several digital logic circuits (the NOR gate circuit 1, the latch circuit 2 and the output control circuit 3). Since no storage capacitor is present in the shift register, the whole area of the shift register can be efficiently reduced, thereby facilitating the implementation of a narrow bezel. In the meantime, the shift register provided by this embodiment is controlled by only one control signal (i.e., the clock control signal inputted from the clock control signal terminal CLK), and thus the entire power consumption of the shift register can be efficiently reduced. In addition, since the latch circuit 2 has a function of retaining output signals, it is ensured that a low-level signal is retained at the first output terminal Q of the latch circuit 2 and a high-level signal is retained at the second output terminal QB of the latch circuit 2 during subsequent process of repeating the third period and the fourth period, so that a low-level signal is retained at the signal output terminal OUTPUT of the shift register, and therefore, there is no need for a reset signal in a gate driving circuit including a plurality of cascaded shift registers, so connection wires for transferring the reset signal between every two adjacent shift registers can be omitted, which reduces the complexity of the entire gate driving circuit.

Third Embodiment

This embodiment provides a method for driving a shift register, wherein the shift register is a shift register according to the first embodiment or the second embodiment, and the detailed content thereof can be referred to the above description of the first embodiment or the second embodiment and is omitted herein.

Referring to the timing shown in FIG. 3, the method for driving the shift register includes a first period to a fourth period as follows.

In the first period, the clock control signal inputted from the clock control signal terminal is a low-level signal, the input signal inputted from the signal input terminal is a high-level signal, a low-level signal is outputted from the output terminal of the NOR gate circuit, a high-level signal is outputted from the first output terminal of the latch circuit, a low-level signal is outputted from the second output terminal of the latch circuit, and a low-level signal is outputted from the signal output terminal.

In the second period, the clock control signal inputted from the clock control signal terminal is a high-level signal, the input signal inputted from the signal input terminal is a low-level signal, a low-level signal is outputted from the output terminal of the NOR gate circuit, a high-level signal is outputted from the first output terminal of the latch circuit, a low-level signal is outputted from the second output terminal of the latch circuit, and a high-level signal is outputted from the signal output terminal.

In the third period, the clock control signal inputted from the clock control signal terminal is a low-level signal, the input signal inputted from the signal input terminal is a low-level signal, a high-level signal is outputted from the output terminal of the NOR gate circuit, a low-level signal is outputted from the first output terminal of the latch circuit, a high-level signal is outputted from the second output terminal of the latch circuit, and a low-level signal is outputted from the signal output terminal.

In the fourth period, the clock control signal inputted from the clock control signal terminal is a high-level signal, the input signal inputted from the signal input terminal is a low-level signal, a low-level signal is outputted from the output terminal of the NOR gate circuit, a low-level signal is outputted from the first output terminal of the latch circuit, a high-level signal is outputted from the second output terminal of the latch circuit, and a low-level signal is outputted from the signal output terminal.

Fourth Embodiment

Figure 4:
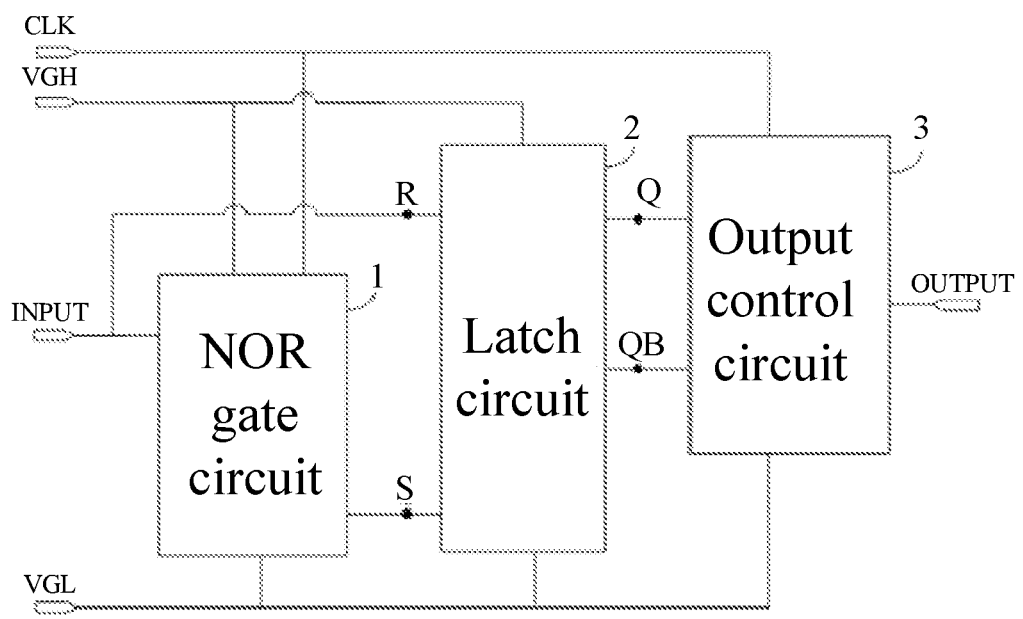
FIG. 4 is a structural schematic diagram of a shift register provided by an embodiment of the present invention.

FIG. 4 is a structural schematic diagram of a shift register provided by the fourth embodiment of the present invention. As show in FIG. 4, the shift register includes a NOR gate circuit 1, a latch circuit 2 and an output control circuit 3.

A first input terminal of the NOR gate circuit 1 is connected to the clock control signal terminal CLK, a second input terminal of the NOR gate circuit 1 is connected to the signal input terminal INPUT, a third input terminal of the NOR gate circuit 1 is connected to a high-level power supply terminal VGH, a fourth input terminal of the NOR gate circuit 1 is connected to a low-level power supply terminal VGL, and an output terminal of the NOR gate circuit 1 is connected to a second input terminal S of the latch circuit 2; a first input terminal R of the latch circuit 2 is connected to the signal input terminal INPUT, a third input terminal of the latch circuit 2 is connected to the high-level power supply terminal VGH, a fourth input terminal of the latch circuit 2 is connected to the low-level power supply terminal VGL, and both a first output terminal Q and a second output terminal QB of the latch circuit 2 are connected to the output control circuit 3, wherein the first input terminal R and the second input terminal S of the latch circuit 2 correspond to the first output terminal Q and the second output terminal QB of the latch circuit 2, respectively; the output control circuit 3 is connected to the clock control signal terminal CLK, the low-level power supply terminal VGL and the signal output terminal OUTPUT, and is used for outputting a clock control signal, provided by the clock control signal terminal CLK, to the signal output terminal OUTPUT when a low-level signal is outputted from the first output terminal Q of the latch circuit 2, or for outputting a low-level power supply signal, provided by the low-level power supply terminal VGL, to the signal output terminal OUTPUT when a low-level signal is outputted from the second output terminal QB of the latch circuit 2.

The shift register provided by this embodiment has a simple structure and does not need to be provided with a storage capacitor, so the whole area of the shift register can be efficiently reduced, thereby facilitating the implementation of the narrow bezel.

Fifth Embodiment

Figure 5:
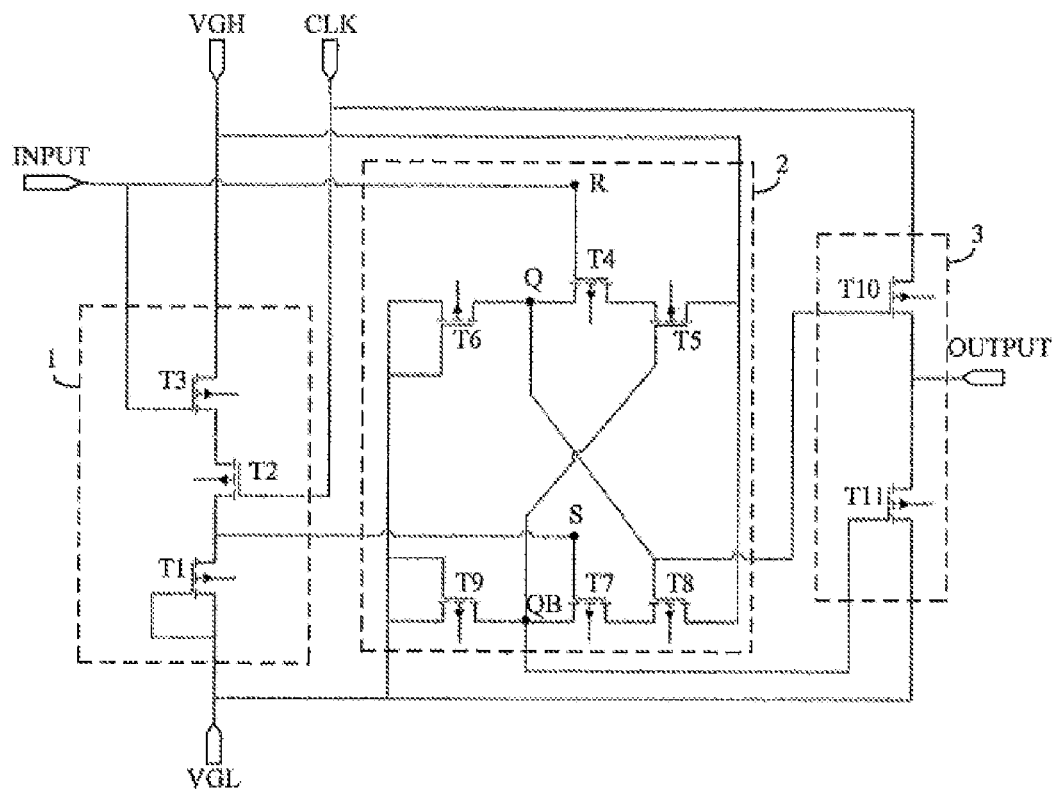
FIG. 5 is a circuit schematic diagram of a shift register provided by an embodiment of the present invention.

FIG. 5 is a circuit schematic diagram of a shift register provided by the fifth embodiment of the present invention. As show in FIG. 5, the shift register shown in FIG. 5 may correspond to the shift register shown in FIG. 1. Specifically, the NOR gate circuit 1 includes a first transistor T1, a second transistor T2 and a third transistor T3. A control electrode of the first transistor T1 is connected to a first electrode of the first transistor T1 as well as the low-level power supply terminal VGL, and a second electrode of the first transistor T1 is connected to a second electrode of the second transistor T2 and the second input terminal S of the latch circuit 2; a control electrode of the second transistor T2 is connected to the clock control signal terminal CLK, and a first electrode of the second transistor T2 is connected to a second electrode of the third transistor T3; a control electrode of the third transistor T3 is connected to the signal input terminal INPUT, and a first electrode of the third transistor T3 is connected to the high-level power supply terminal VGH.

It needs to be explained that the above specific structure of the NOR gate circuit 1 is only an optional solution in this embodiment, and the NOR gate circuit 1 in this embodiment may further employ other structures, which are not listed and illustrated herein.

The latch circuit 2 may include a first NOR gate sub circuit and a second NOR gate sub circuit; a first input terminal of the first NOR gate sub circuit is connected to the signal input terminal INPUT, a second input terminal of the first NOR gate sub circuit is connected to an output terminal of the second NOR gate sub circuit, and an output terminal of the first NOR gate sub circuit is connected to the output control circuit 3 and a second input terminal of the second NOR gate sub circuit; a first input terminal of the second NOR gate sub circuit is connected to the output terminal of the NOR gate circuit 1, and the output terminal of the second NOR gate sub circuit is connected to the output control circuit 3; the first input terminal of the first NOR gate sub circuit is the first input terminal R of the latch circuit 2, the first input terminal of the second NOR gate sub circuit is the second input terminal S of the latch circuit 2, the output terminal of the first NOR gate sub circuit is the first output terminal Q of the latch circuit 2, and the output terminal of the second NOR gate sub circuit is the second output terminal QB of the latch circuit 2.

Specifically, the first NOR gate sub circuit may include a fourth transistor T4, a fifth transistor T5 and a sixth transistor T6, wherein, a control electrode (which corresponds to the first input terminal of the first NOR gate sub circuit) of the fourth transistor T4 is connected to the signal input terminal INPUT, a first electrode of the fourth transistor T4 is connected to a second electrode of the fifth transistor T5, and a second electrode of the fourth transistor T4 is connected to the output control circuit 3 and a second electrode of the sixth transistor T6; a control electrode (which corresponds to the second input terminal of the first NOR gate sub circuit) of the fifth transistor T5 is connected to the output terminal of the second NOR gate sub circuit, and a first electrode of the fifth transistor T5 is connected to the high-level power supply terminal VGH; a control electrode of the sixth transistor T6 is connected to a first electrode of the sixth transistor T6 as well as the low-level power supply terminal VGL, and the second electrode of the sixth transistor T6 is connected to the output control circuit 3.

Specifically, the second NOR gate sub circuit may include a seventh transistor T7, an eighth transistor T8 and a ninth transistor T9. A control electrode (which corresponds to the first input terminal of the second NOR gate sub circuit) of the seventh transistor T7 is connected to the output terminal of the NOR gate circuit 1, a first electrode of the seventh transistor T7 is connected to a second electrode of the eighth transistor T8, and a second electrode of the seventh transistor T7 is connected to the output control circuit 3 and a second electrode of the ninth transistor T9; a control electrode (which corresponds to the second input terminal of the second NOR gate sub circuit) of the eighth transistor T8 is connected to the output terminal of the first NOR gate sub circuit, a first electrode of the eighth transistor T8 is connected to the high-level power supply terminal VGH, and a second electrode of the eighth transistor T8 is connected to the output control circuit 3 and a second electrode of the ninth transistor T9; a control electrode of the ninth transistor T9 is connected to a first electrode of the ninth transistor T9 as well as the low-level power supply terminal VGL, and the second electrode of the ninth transistor T9 is connected to the output control circuit 3. The second electrode of the seventh transistor T7 and the second electrode of the ninth transistor T9 are connected at the output terminal of the second NOR gate sub circuit.

It needs to be explained that the above specific structure of the latch circuit 2 is only an optional solution in this embodiment, and the latch circuit 2 in this embodiment may further employ other structures, which are not listed and illustrated herein.

The output control circuit 3 may include a tenth transistor T10 and an eleventh transistor T11; a control electrode of the tenth transistor T10 is connected to the first output terminal Q of the latch circuit 2, a first electrode of the tenth transistor T10 is connected to the clock control signal terminal CLK, and a second electrode of the tenth transistor T10 is connected to the signal output terminal OUTPUT; a control electrode of the eleventh transistor T11 is connected to the second output terminal QB of the latch circuit 2, a first electrode of the eleventh transistor T11 is connected to the low-level power supply terminal VGL, and a second electrode of the eleventh transistor T11 is connected to the signal output terminal OUTPUT.

It needs to be explained that transistor(s) in the above circuits is separately selected from one of polysilicon thin-film transistors, amorphous silicon thin-film transistors, oxide thin-film transistors and organic thin-film transistors. The "control electrode" referred to in this embodiment particularly means a gate of a transistor, "first electrode" particularly means a source of a transistor, and correspondingly, "second electrode" particularly means a drain of a transistor. Apparently, those skilled in the art should aware that the "first electrode" and the "second electrode" may interchange with each other.

In the above shift register provided by this embodiment, all transistors in the above-mentioned structures may be P-type transistors.

It needs to be explained that, among all above-mentioned transistors, the first transistor T1, the sixth transistor T6 and the ninth transistor T9 are all used as loads having a large impedance, and the remaining transistors are all used as switches.

An operation process of the shift register in this embodiment will be described in detail below in conjunction with the accompanying drawings. Here, it is assumed that each transistor in the shift register is a P-type transistor, which is turned on with a high level at the control electrode and is turned off with a low level at the control electrode.

Figure 6:
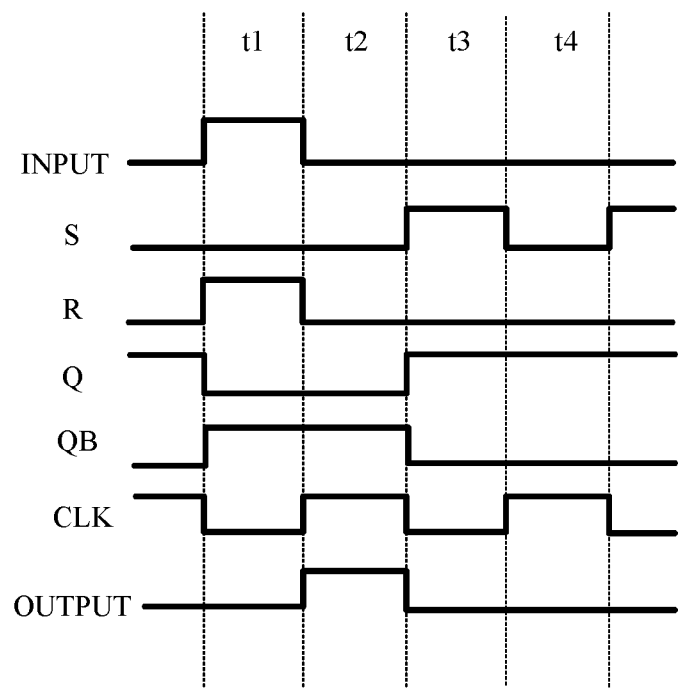
FIG. 6 is an operation timing diagram of the shift register as shown in FIG. 5.

FIG. 6 is an operation timing diagram of the shift register as shown in FIG. 5, and as shown in FIG. 6, the operation process of the shift register includes a first period to a fourth period as follows.

In the first period t1, the clock control signal inputted from the clock control signal terminal CLK is a low-level signal, and the input signal inputted from the signal input terminal INPUT is a high-level signal. At this time, the second transistor T2, the seventh transistor T7, the eighth transistor T8, the tenth transistor T10 are all turned on, and the third transistor T3, the fourth transistor T4, the fifth transistor T5 and the eleventh transistor T11 are all turned off.

Specifically, in the NOR gate circuit 1, since the clock control signal inputted from the clock control signal terminal CLK is a low-level signal and the input signal is a high-level signal, the second transistor T2 is turned on and the third transistor T3 is turned off, and at this time, the output terminal of the NOR gate circuit 1 outputs a low-level signal, i.e., the signal at the second input terminal S of the latch circuit 2 is a low-level signal.

In the latch circuit 2, since the signal inputted from the first input terminal R (i.e., the signal input terminal INPUT) of the latch circuit 2 is a high-level signal, the fourth transistor T4 is turned off, and at this time, the first output terminal Q of the latch circuit 2 outputs a low-level signal. In the meantime, the eighth transistor T8 is turned on. In addition, since the signal inputted from the second input terminal S of the latch circuit 2 is a low-level signal, the seventh transistor T7 is turned on, and thus a high-level signal outputted from the high-level power supply terminal VGH is transferred to the second output terminal QB of the latch circuit 2 through the eighth transistor T8 and the seventh transistor T7, i.e., a high-level signal is outputted from the second output terminal QB of the latch circuit 2. At this time, the fifth transistor T5 is turned off.

In the output control circuit 3, since a high-level signal is outputted from the second output terminal QB of the latch circuit 2, the eleventh transistor T11 is turned off. In the meantime, since a low-level signal is outputted from the first output terminal Q of the latch circuit 2, the tenth transistor T10 is turned on, and because the signal inputted from the clock control signal terminal CLK is a low-level signal at this time, a low-level signal is outputted from the signal output terminal OUTPUT of the shift register.

In the second period t2, the clock control signal inputted from the clock control signal terminal CLK is a high-level signal, and the input signal inputted from the signal input terminal INPUT is a low-level signal. At this time, the third transistor T3, the fourth transistor T4, the seventh transistor T7, the eighth transistor T8 and the tenth transistor T10 are all turned on, and the second transistor T2, the fifth transistor T5 and the eleventh transistor T11 are all turned off.

Specifically, in the NOR gate circuit 1, since the clock control signal inputted from the clock control signal terminal CLK is a high-level signal and the input signal is a low-level signal, the second transistor T2 is turned off and the third transistor T3 is turned on, and at this time, the output terminal of the NOR gate circuit 1 outputs a low-level signal, i.e., the signal at the second input terminal S of the latch circuit 2 is a low-level signal.

In the latch circuit 2, since the signal inputted from the second input terminal S of the latch circuit 2 is a low-level signal, he seventh transistor T7 is turned on, and in the meantime, the eighth transistor T8 remains the on state of the previous period (the first period t1), a high-level signal is continuously inputted from the second input terminal S of the latch circuit 2, and at this time the fifth transistor T5 remains the off state. No current loop including the sixth transistor T6 has been formed due to the off state of the fifth transistor T5, the low-level signal outputted from the low-level power supply terminal VGL may be transferred to the first output terminal Q of the latch circuit 2 through the sixth transistor T6, i.e., the first output terminal Q of the latch circuit 2 outputs a low-level signal.

In the output control circuit 3, since a high-level signal is outputted from the second output terminal QB of the latch circuit 2, the eleventh transistor T11 is turned off. In the meantime, since a low-level signal is outputted from the first output terminal Q of the latch circuit 2, the tenth transistor T10 is turned on, and because the signal inputted from the clock control signal terminal CLK is a high-level signal at this time, a high-level signal is outputted from the signal output terminal OUTPUT of the shift register.

In the third period t3, the clock control signal inputted from the clock control signal terminal CLK is a low-level signal, and the input signal inputted from the signal input terminal INPUT is a low-level signal. At this time, the second transistor T2, the third transistor T3, the fourth transistor T4, the fifth transistor T5 and the eleventh transistor T11 are turned on, and the seventh transistor T7, the eighth transistor T8 and the tenth transistor T10 are turned off.

Specifically, in the NOR gate circuit 1, since the clock control signal inputted from the clock control signal terminal CLK is a low-level signal and the input signal is a low-level signal, the second transistor T2 and the third transistor T3 are both turned on, and at this time, a high-level signal is outputted from the NOR gate circuit 1, i.e., the signal inputted from the second input terminal S of the latch circuit 2 is a high-level signal.

In the latch circuit 2, since the signal at the second input terminal S of the latch circuit 2 is a high-level signal, the seventh transistor T7 is turned off, and at this time, no current loop including the ninth transistor T9 has been formed, and a low-level signal outputted from the low-level power supply terminal VGL may be transferred to the second output terminal QB of the latch circuit 2 through the ninth transistor T9, i.e., the second output terminal QB of the latch circuit 2 outputs a low-level signal. At this time, the fifth transistor T5 is turned on. In addition, since the signal inputted from the first input terminal R of the latch circuit 2 is a low-level signal, the fourth transistor T4 is turned on, and a high-level signal outputted from the high-level power supply terminal VGH is transferred to the first output terminal Q of the latch circuit 2 through the fifth transistor T5 and the fourth transistor T4, i.e., the first output terminal Q of the latch circuit 2 outputs a high-level signal, and at this time the eighth transistor T8 is turned off.

In the output control circuit 3, since a high-level signal is outputted from the first output terminal Q of the latch circuit 2, the tenth transistor T10 is turned off. In the meantime, since a low-level signal is outputted from the second output terminal QB of the latch circuit 2, the eleventh transistor T11 is turned on, a low-level signal provided by the low-level power supply terminal VGL is transferred to the signal output terminal OUTPUT through the eleventh transistor T11, i.e., a low-level signal is outputted from the signal output terminal OUTPUT.

In the fourth period t4, the clock control signal inputted from the clock control signal terminal CLK is a high-level signal, and the input signal inputted from the signal input terminal INPUT is a low-level signal. At this time, the third transistor T3, the fourth transistor T4, the fifth transistor T5, the seventh transistor T7 and the eleventh transistor T11 are turned on, and the second transistor T2, the eighth transistor T8 and the tenth transistor T10 are turned off.

Specifically, in the NOR gate circuit 1, since the clock control signal inputted from the clock control signal terminal CLK is a high-level signal and the input signal is a low-level signal, the second transistor T2 is turned off and the third transistor T3 is turned on, and at this time, the output terminal of the NOR gate circuit 1 outputs a low-level signal, i.e., the signal at the first input terminal R of the latch circuit 2 is a low-level signal.

In the latch circuit 2, since the signal at the first input terminal R of the latch circuit 2 is a low-level signal, the fourth transistor T4 is turned on, and in the meantime, since the signal inputted from the second input terminal S of the latch circuit 2 is a low-level signal, the seventh transistor T7 is turned on. At this time, the first output terminal Q and the second output terminal QB of the latch circuit 2 retain respective output signals of the previous period (the third period t3), i.e., the first output terminal Q of the latch circuit 2 outputs a high-level signal, and the second output terminal QB of the latch circuit 2 outputs a low-level signal.

In the output control circuit 3, since a high-level signal is outputted from the first output terminal Q of the latch circuit 2, the tenth transistor T10 is turned off. In the meantime, since a low-level signal is outputted from the second output terminal QB of the latch circuit 2, the eleventh transistor T11 is turned on, and a low-level signal provided by the low-level power supply terminal VGL is transferred to the signal output terminal OUTPUT through the eleventh transistor T11, i.e., the signal output terminal OUTPUT outputs a low-level signal.

Thereafter, the above third period t3 and the above fourth period t4 are repeated until the input signal inputted from the signal input terminal INPUT is changed to a high-level signal. The first period t1 is restarted at the time when the input signal inputted from the signal input terminal INPUT is changed to a high-level signal.

It could be seen from the above-mentioned process that, the shift register provided by this embodiment can realize a function of the conventional shift register only by several digital logic circuits (the NOR gate circuit 1, the latch circuit 2 and the output control circuit 3). Since no storage capacitor is present in the shift register, the whole area of the shift register can be efficiently reduced, thereby facilitating the implementation of a narrow bezel. In the meantime, the shift register provided by this embodiment is controlled by only one control signal (i.e., the clock control signal inputted from the clock control signal terminal CLK), and thus the entire power consumption of the shift register can be efficiently reduced. In addition, since the latch circuit 2 has a function of retaining output signals, it is ensured that a low-level signal is retained at the first output terminal Q of the latch circuit 2 and a high-level signal is retained at the second output terminal QB of the latch circuit 2 during subsequent process of repeating the third period and the fourth period, so that a low-level signal is retained at the signal output terminal OUTPUT of the shift register, and therefore, there is no need for a reset signal in a gate driving circuit including a plurality of cascaded shift registers, so connection wires for transferring the reset signal between every two adjacent shift registers can be omitted, which reduces the complexity of the entire gate driving circuit.

Sixth Embodiment

This embodiment provides a method for driving a shift register, wherein the shift register is a shift register according to the fourth embodiment or the fifth embodiment, and the detailed content thereof can be referred to the above description of the fourth embodiment or the fifth embodiment and is omitted herein.

Referring to the timing shown in FIG. 6, the method for driving the shift register includes a first period to a fourth period as follows.

In the first period, the clock control signal inputted from the clock control signal terminal is a low-level signal, the input signal inputted from the signal input terminal is a high-level signal, a low-level signal is outputted from the output terminal of the NOR gate circuit, a low-level signal is outputted from the first output terminal of the latch circuit, a high-level signal is outputted from the second output terminal of the latch circuit, and a low-level signal is outputted from the signal output terminal.

In the second period, the clock control signal inputted from the clock control signal terminal is a high-level signal, the input signal inputted from the signal input terminal is a low-level signal, a low-level signal is outputted from the output terminal of the NOR gate circuit, a low-level signal is outputted from the first output terminal of the latch circuit, a high-level signal is outputted from the second output terminal of the latch circuit, and a high-level signal is outputted from the signal output terminal.

In the third period, the clock control signal inputted from the clock control signal terminal is a low-level signal, the input signal inputted from the signal input terminal is a low-level signal, a high-level signal is outputted from the output terminal of the NOR gate circuit, a high-level signal is outputted from the first output terminal of the latch circuit, a low-level signal is outputted from the second output terminal of the latch circuit, and a low-level signal is outputted from the signal output terminal.

In the fourth period, the clock control signal inputted from the clock control signal terminal is a high-level signal, the input signal inputted from the signal input terminal is a low-level signal, a low-level signal is outputted from the output terminal of the NOR gate circuit, a high-level signal is outputted from the first output terminal of the latch circuit, a low-level signal is outputted from the second output terminal of the latch circuit, and a low-level signal is outputted from the signal output terminal.

Seventh Embodiment

Figure 7:
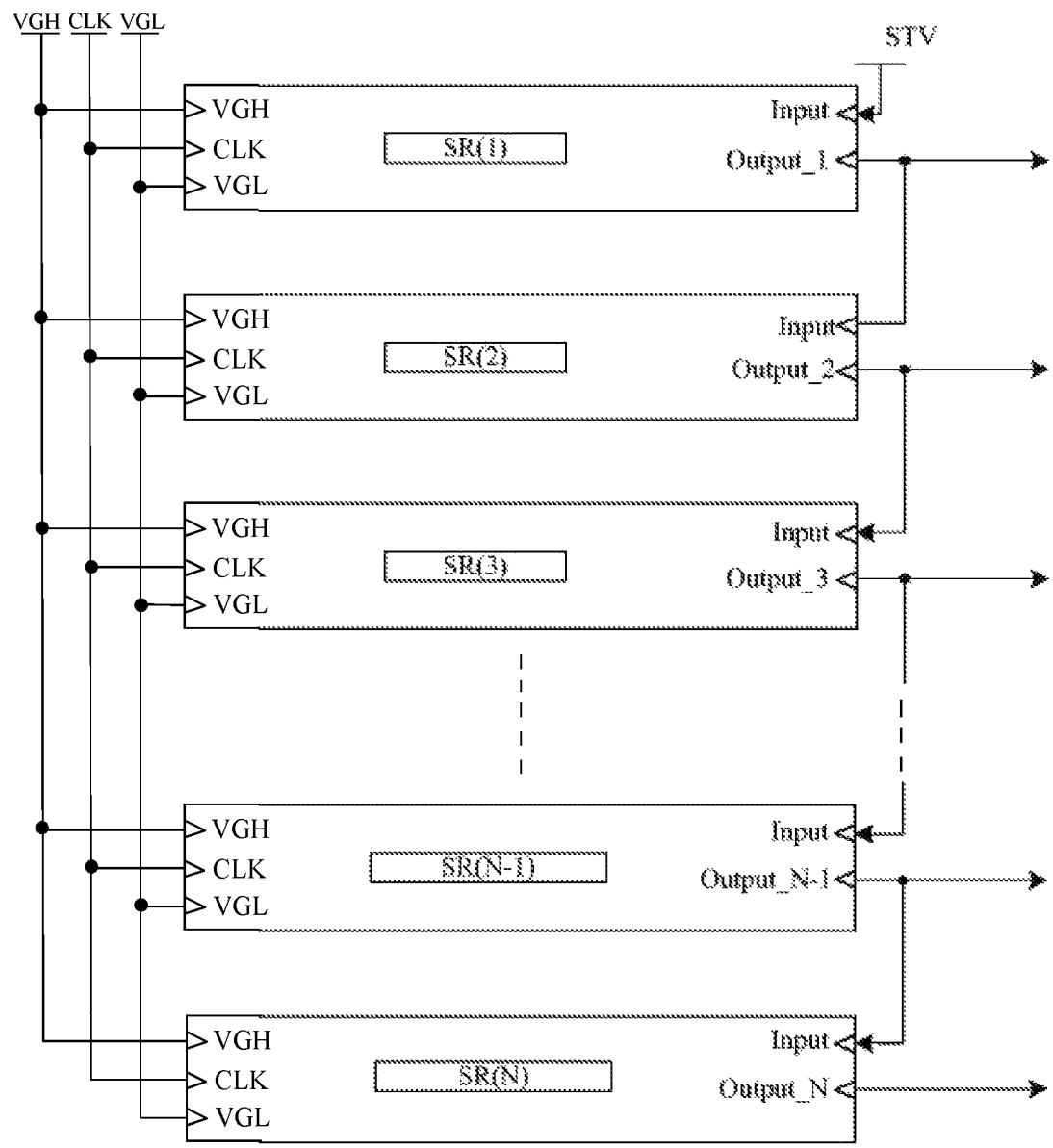
FIG. 7 is a structural schematic diagram of a gate driving circuit provided by an embodiment of the present invention.

FIG. 7 is a structural schematic diagram of a gate driving circuit provided by this embodiment. As shown in FIG. 7, the gate driving circuit includes a plurality of cascaded shift registers SR(1)-SR(N), where the shift registers are shift registers according to the first embodiment, the second embodiment, the fourth embodiment or the fifth embodiment. When the shift register according to the first embodiment or the second embodiment is employed, a method for driving the shift register, according to the third embodiment, may be used, and when the shift register according to the third embodiment or the fourth embodiment is employed, a method for driving the shift register, according to the sixth embodiment, may be used. In the gate driving circuit, the signal input terminal of each stage of the shift register, except for the first stage of the shift register SR(1) and the last stage of the shift register SR(N), is connected to the signal output terminal of the previous stage of the shift register, and a frame starting signal STV is provided to the signal input terminal of the first stage of the shift register SR(1). Gate driving signals are outputted, by the gate driving circuit, sequentially from the signal output terminals of respective stages of the shift registers, under the control of the frame starting signal STY.

This embodiment further provides a display device which includes the above gate driving circuit, the specific content of which can be referred to the above description and is omitted herein.

The beneficial effect of the present invention is as follows: the embodiments of the present invention provides a shift register and a method for driving the same, a gate driving circuit and a display device, wherein the shift register can realize a function of the conventional shift register only by several digital logic circuits (a NOR gate circuit, a latch circuit and an output control circuit). Since no storage capacitor is present in the shift register, the whole area of the shift register can be efficiently reduced, thereby facilitating the implementation of a narrow-bezel display device. In the meantime, the shift register provided by the embodiments of the present invention is controlled by only one control signal (i.e., the clock control signal inputted from the clock control signal terminal) therein, and thus the entire power consumption of the shift register can be efficiently reduced. In addition, since the latch circuit has a function of retaining output signals, it is ensured that a low-level signal is retained at the first output terminal of the latch circuit and a high-level signal is retained at the second output terminal of the latch circuit during subsequent process of repeating the third period and the fourth period, so that a low-level signal is retained at the signal output terminal of the shift register, and therefore, there is no need for a reset signal in a gate driving circuit including a plurality of cascaded shift registers, so connection wires for transferring the reset signal between every two adjacent shift registers can be omitted, which reduces the complexity of the entire gate driving circuit.

It can be understood that the foregoing implementations are merely exemplary implementations used for describing the principle of the present invention, but the present invention is not limited thereto. Those of ordinary skill in the art may make various variations and improvements without departing from the spirit and essence of the present invention, and these variations and improvements shall fall into the protection scope of the present invention.

What is claimed is:

1. A shift register, comprising a NOR gate circuit, a latch circuit and an output control circuit, wherein,
   a first input terminal of the NOR gate circuit is connected to a clock control signal terminal, a second input terminal of the NOR gate circuit is connected to a signal input terminal, a third input terminal of the NOR gate circuit is connected to a high-level power supply terminal, a fourth input terminal of the NOR gate circuit is connected to a low-level power supply terminal, and an output terminal of the NOR gate circuit is connected to a first input terminal of the latch circuit;

a second input terminal of the latch circuit is connected to the signal input terminal, a third input terminal of the latch circuit is connected to the high-level power supply terminal, a fourth input terminal of the latch circuit is connected to the low-level power supply terminal, and both a first output terminal and a second output terminal of the latch circuit are connected to the output control circuit, wherein the first and second input terminals of the latch circuit correspond to the first and second output terminals of the latch circuit, respectively; and the output control circuit is connected to the clock control signal terminal, the low-level power supply terminal and a signal output terminal, and is used for outputting a clock control signal, provided by the clock control signal terminal, to the signal output terminal when a high-level signal is outputted from the first output terminal of the latch circuit, or for outputting a low-level power supply signal, provided by the low-level power supply terminal, to the signal output terminal when a high-level signal is outputted from the second output terminal of the latch circuit.

2. The shift register according to claim 1, wherein the NOR gate circuit includes a first transistor, a second transistor and a third transistor;

a control electrode of the first transistor is connected to a first electrode of the first transistor and the high-level power supply terminal, and a second electrode of the first transistor is connected to a second electrode of the second transistor, a second electrode of the third transistor and the first input terminal of the latch circuit;

a control electrode of the second transistor is connected to the clock control signal terminal, a first electrode of the second transistor is connected to the low-level power supply terminal, and the second electrode of the second transistor is connected to the first input terminal of the latch circuit; and a control electrode of the third transistor is connected to the signal input terminal, a first electrode of the third transistor is connected to the low-level power supply terminal, and the second electrode of the third transistor is connected to the first input terminal of the latch circuit.

3. The shift register according to claim 1, wherein the latch circuit includes a first NOR gate sub circuit and a second NOR gate sub circuit;

a first input terminal of the first NOR gate sub circuit is connected to the output terminal of the NOR gate circuit, a second input terminal of the first NOR gate sub circuit is connected to an output terminal of the second NOR gate sub circuit, and an output terminal of the first NOR gate sub circuit is connected to the output control circuit and a second input terminal of the second NOR gate sub circuit;

a first input terminal of the second NOR gate sub circuit is connected to the signal input terminal, and the output terminal of the second NOR gate sub circuit is connected to the output control circuit; and the first input terminal of the first NOR gate sub circuit is the first input terminal of the latch circuit, the first input terminal of the second NOR gate sub circuit is the second input terminal of the latch circuit, the output terminal of the first NOR gate sub circuit is the first output terminal of the latch circuit, and the output terminal of the second NOR gate sub circuit is the second output terminal of the latch circuit.

4. The shift register according to claim 3, wherein the first NOR gate sub circuit includes a fourth transistor, a fifth transistor and a sixth transistor;

a control electrode of the fourth transistor is connected to the output terminal of the NOR gate circuit, a first electrode of the fourth transistor is connected to the low-level power supply terminal, and a second electrode of the fourth transistor is connected to the output control circuit and a second electrode of the sixth transistor;

a control electrode of the fifth transistor is connected to the output terminal of the second NOR gate sub circuit, a first electrode of the fifth transistor is connected to the low-level power supply terminal, and a second electrode of the fifth transistor is connected to the output control circuit and the second electrode of the sixth transistor;

a control electrode of the sixth transistor is connected to a first electrode of the sixth transistor and the high-level power supply terminal, and the second electrode of the sixth transistor is connected to the output control terminal; and the second electrode of the fourth transistor, the second electrode of the fifth transistor and the second electrode of the sixth transistor are connected at the output terminal of the first NOR gate sub circuit.

5. The shift register according to claim 3, wherein the second NOR gate sub circuit includes a seventh transistor, an eighth transistor and a ninth transistor;

a control electrode of the seventh transistor is connected to the signal input terminal, a first electrode of the seventh transistor is connected to the low-level power supply terminal, and a second electrode of the seventh transistor is connected to the output control circuit and a second electrode of the ninth transistor;

a control electrode of the eighth transistor is connected to the output terminal of the first NOR gate sub circuit, a first electrode of the eighth transistor is connected to the low-level power supply terminal, and a second electrode of the eighth transistor is connected to the output control circuit and the second electrode of the ninth transistor; and a control electrode of the ninth transistor is connected to a first electrode of the ninth transistor and the high-level power supply terminal, and the second electrode of the ninth transistor is connected to the output control circuit.

6. The shift register according to claim 1, wherein the output control circuit includes a tenth transistor and an eleventh transistor;

a control electrode of the tenth transistor is connected to the first output terminal of the latch circuit, a first electrode of the tenth transistor is connected to the clock control signal terminal, and a second electrode of the tenth transistor is connected to the signal output terminal; and a control electrode of the eleventh transistor is connected to the second output terminal of the latch circuit, a first electrode of the eleventh transistor is connected to the low-level power supply terminal, and a second electrode of the eleventh transistor is connected to the signal output terminal.

7. The shift register according to claim 1, wherein the NOR gate circuit, the latch circuit and the output control circuit include transistors, all of which are N-type transistors.

8. A shift register, comprising a NOR gate circuit, a latch circuit and an output control circuit, wherein,
   a first input terminal of the NOR gate circuit is connected to a clock control signal terminal, a second input terminal of the NOR gate circuit is connected to a signal input terminal, a third input terminal of the NOR gate circuit is connected to a high-level power supply terminal, a fourth input terminal of the NOR gate circuit is connected to a low-level power supply terminal, and an output terminal of the NOR gate circuit is connected to a second input terminal of the latch circuit;
   a first input terminal of the latch circuit is connected to the signal input terminal, a third input terminal of the latch circuit is connected to the high-level power supply terminal, a fourth input terminal of the latch circuit is connected to the low-level power supply terminal, and both a first output terminal and a second output terminal of the latch circuit are connected to the output control circuit, wherein the first and second input terminals of the latch circuit correspond to the first and second output terminals of the latch circuit, respectively; and
   the output control circuit is connected to the clock control signal terminal, the low-level power supply terminal and a signal output terminal, and is used for outputting a clock control signal, provided by the clock control signal terminal, to the signal output terminal when a low-level signal is outputted from the first output terminal of the latch circuit, or for outputting a low-level power supply signal, provided by the low-level power supply terminal, to the signal output terminal when a low-level signal is outputted from the second output terminal of the latch circuit.

9. The shift register according to claim 8, wherein the NOR gate circuit includes a first transistor, a second transistor and the third transistor;
   a control electrode of the first transistor is connected to a first electrode of the first transistor and the low-level power supply terminal, and a second electrode of the first transistor is connected to a second electrode of the second transistor and the second input terminal of the latch circuit;
   a control electrode of the second transistor is connected to the clock control signal terminal, a first electrode of the second transistor is connected to a second electrode of the third transistor, and the second electrode of the second transistor is connected to the second input terminal of the latch circuit; and
   a control electrode of the third transistor is connected to the signal input terminal, and a first electrode of the third transistor is connected to the high-level power supply terminal.

10. The shift register according to claim 8, wherein the latch circuit includes a first NOR gate sub circuit and a second NOR gate sub circuit;
    a first input terminal of the first NOR gate sub circuit is connected to the signal input terminal, a second input terminal of the first NOR gate sub circuit is connected to an output terminal of the second NOR gate sub circuit, and an output terminal of the first NOR gate sub circuit is connected to the output control circuit and a second input terminal of the second NOR gate sub circuit;
    a first input terminal of the second NOR gate sub circuit is connected to the output terminal of the NOR gate circuit, and the output terminal of the second NOR gate sub circuit is connected to the output control circuit; and
    the first input terminal of the first NOR gate sub circuit is the first input terminal of the latch circuit, the first input terminal of the second NOR gate sub circuit is the second input terminal of the latch circuit, the output terminal of the first NOR gate sub circuit is the first output terminal of the latch circuit, and the output terminal of the second NOR gate sub circuit is the second output terminal of the latch circuit.

11. The shift register according to claim 10, wherein the first NOR gate sub circuit includes a fourth transistor, a fifth transistor and a sixth transistor;
    a control electrode of the fourth transistor is connected to the signal input terminal, a first electrode of the fourth transistor is connected to a second electrode of the fifth transistor, and a second electrode of the fourth transistor is connected to the output control circuit and a second electrode of the sixth transistor;
    a control electrode of the fifth transistor is connected to the output terminal of the second NOR gate sub circuit, and a first electrode of the fifth transistor is connected to the high-level power supply terminal; and
    a control electrode of the sixth transistor is connected to a first electrode of the sixth transistor and the low-level power supply terminal, and the second electrode of the sixth transistor is connected to the output control circuit.

12. The shift register according to claim 10, wherein the second NOR gate sub circuit includes a seventh transistor, an eighth transistor and a ninth transistor;
    a control electrode of the seventh transistor is connected to the output terminal of the NOR gate circuit, a first electrode of the seventh transistor is connected to a second electrode of the eighth transistor, and a second electrode of the seventh transistor is connected to the output control circuit and a second electrode of the ninth transistor;
    a control electrode of the eighth transistor is connected to the output terminal of the first NOR gate sub circuit, a first electrode of the eighth transistor is connected to the high-level power supply terminal, and the second electrode of the eighth transistor is connected to the output control circuit and the second electrode of the ninth transistor; and
    a control electrode of the ninth transistor is connected to a first electrode of the ninth transistor and the low-level power supply terminal, and the second electrode of the ninth transistor is connected to the output control circuit.

13. The shift register according to claim 8, wherein the output control circuit includes a tenth transistor and an eleventh transistor;
    a control electrode of the tenth transistor is connected to the first output terminal of the latch circuit, a first electrode of the tenth transistor is connected to the clock control signal terminal, and a second electrode of the tenth transistor is connected to the signal output terminal; and
    a control electrode of the eleventh transistor is connected to the second output terminal of the latch circuit, a first electrode of the eleventh transistor is connected to the low-level power supply terminal, and a second electrode of the eleventh transistor is connected to the signal output terminal.

14. The shift register according to claim 8, wherein the NOR gate circuit, the latch circuit and the output control circuit include transistors, all of which are P-type transistors.

15. A gate driving circuit, comprising a plurality of cascaded shift registers according to claim 1, wherein the signal input terminal of each stage of the shift register, except for a first stage of the shift register and a last stage of the shift register, is connected to the signal output terminal of the previous stage of the shift register, a frame starting signal is provided to the signal input terminal of the first stage of the shift register, and gate driving signals are outputted, by the gate driving circuit, sequentially from the signal output terminals of respective stages of the shift registers.

16. A display device, comprising the gate driving circuit according to claim 15.

17. A method for driving the shift register according to claim 1, the method comprising:

in a first period, the clock control signal inputted from the clock control signal terminal is a low-level signal, an input signal inputted from the signal input terminal is a high-level signal, a low-level signal is outputted from the output terminal of the NOR gate circuit, a high-level signal is outputted from the first output terminal of the latch circuit, a low-level signal is outputted from the second output terminal of the latch circuit, and a low-level signal is outputted from the signal output terminal;

in a second period, the clock control signal inputted from the clock control signal terminal is a high-level signal, the input signal inputted from the signal input terminal is a low-level signal, a low-level signal is outputted from the output terminal of the NOR gate circuit, a high-level signal is outputted from the first output terminal of the latch circuit, a low-level signal is outputted from the second output terminal of the latch circuit, and a high-level signal is outputted from the signal output terminal;

in a third period, the clock control signal inputted from the clock control signal terminal is a low-level signal, the input signal inputted from the signal input terminal is a low-level signal, a high-level signal is outputted from the output terminal of the NOR gate circuit, a low-level signal is outputted from the first output terminal of the latch circuit, a high-level signal is outputted from the second output terminal of the latch circuit, and a low-level signal is outputted from the signal output terminal; and in a fourth period, the clock control signal inputted from the clock control signal terminal is a high-level signal, the input signal inputted from the signal input terminal is a low-level signal, a low-level signal is outputted from the output terminal of the NOR gate circuit, a low-level signal is outputted from the first output terminal of the latch circuit, a high-level signal is outputted from the second output terminal of the latch circuit, and a low-level signal is outputted from the signal output terminal.

18. A method for driving the shift register according to claim 8, the method comprising:

in a first period, the clock control signal inputted from the clock control signal terminal is a low-level signal, an input signal inputted from the signal input terminal is a high-level signal, a low-level signal is outputted from the output terminal of the NOR gate circuit, a low-level signal is outputted from the first output terminal of the latch circuit, a high-level signal is outputted from the second output terminal of the latch circuit, and a low-level signal is outputted from the signal output terminal;

in a second period, the clock control signal inputted from the clock control signal terminal is a high-level signal, the input signal inputted from the signal input terminal is a low-level signal, a low-level signal is outputted from the output terminal of the NOR gate circuit, a low-level signal is outputted from the first output terminal of the latch circuit, a high-level signal is outputted from the second output terminal of the latch circuit, and a high-level signal is outputted from the signal output terminal;

in a third period, the clock control signal inputted from the clock control signal terminal is a low-level signal, the input signal inputted from the signal input terminal is a low-level signal, a high-level signal is outputted from the output terminal of the NOR gate circuit, a high-level signal is outputted from the first output terminal of the latch circuit, a low-level signal is outputted from the second output terminal of the latch circuit, and a low-level signal is outputted from the signal output terminal; and in a fourth period, the clock control signal inputted from the clock control signal terminal is a high-level signal, the input signal inputted from the signal input terminal is a low-level signal, a low-level signal is outputted from the output terminal of the NOR gate circuit, a high-level signal is outputted from the first output terminal of the latch circuit, a low-level signal is outputted from the second output terminal of the latch circuit, and a low-level signal is outputted from the signal output terminal.

* * * * *